United States Patent
Tiner et al.

(10) Patent No.: US 9,822,449 B2
(45) Date of Patent: Nov. 21, 2017

(54) SHOWERHEAD SUPPORT STRUCTURES

(71) Applicant: Applied Materials, Inc., Santa Clara, CA (US)

(72) Inventors: Robin L. Tiner, Santa Cruz, CA (US); Allen K. Lau, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/249,442

(22) Filed: Aug. 28, 2016

(65) Prior Publication Data

US 2017/0081763 A1 Mar. 23, 2017

Related U.S. Application Data

(60) Provisional application No. 62/222,173, filed on Sep. 22, 2015.

(51) Int. Cl.
| | |
|---|---|
| *B05B 1/14* | (2006.01) |
| *C23C 16/455* | (2006.01) |
| *B05B 15/06* | (2006.01) |
| *C23C 16/509* | (2006.01) |
| *H01J 37/32* | (2006.01) |

(52) U.S. Cl.
CPC ........ *C23C 16/45565* (2013.01); *B05B 15/06* (2013.01); *C23C 16/5096* (2013.01); *H01J 37/3244* (2013.01); *H01J 37/32807* (2013.01)

(58) Field of Classification Search
CPC .......... C23C 16/45565; C23C 16/5096; B05B 15/06; H01J 37/3244; H01J 37/32807
USPC ............... 239/548, 552, 556, 557, 558, 559; 118/715; 427/578
See application file for complete search history.

(56) References Cited

U.S. PATENT DOCUMENTS

| | | | |
|---|---|---|---|
| 7,429,410 B2 * | 9/2008 | Keller ................ | H01J 37/3244 427/578 |
| 8,075,690 B2 * | 12/2011 | Keller ............... | C23C 16/45565 118/715 |
| 8,721,791 B2 * | 5/2014 | Tiner ..................... | B05B 1/005 118/715 |
| 2009/0007846 A1 | 1/2009 | Keller et al. | |

(Continued)

FOREIGN PATENT DOCUMENTS

| | | |
|---|---|---|
| KR | 20020074923 A | 10/2002 |
| KR | 20140055655 A | 5/2014 |

OTHER PUBLICATIONS

International Search Report and Written Opinion for Application No. PCT/US2016/048026 dated Nov. 18, 2016.

*Primary Examiner* — Steven J Ganey
(74) *Attorney, Agent, or Firm* — Patterson + Sheridan LLP (57) ABSTRACT

Embodiments of the present disclosure generally provide apparatus and methods for supporting a gas distribution showerhead in a processing chamber. In one embodiment, a gas distribution showerhead for a vacuum chamber includes a rectangular body having four sides, a first major surface and a second major surface opposite the first major surface, and a plurality of gas passages formed through the body in a longitudinal direction between the first and second major surfaces, a center support member coupled to the body in a center region thereof, and a mid-support member coupled to the body between the center region and the side.

18 Claims, 8 Drawing Sheets

(56) References Cited

U.S. PATENT DOCUMENTS

2014/0246521 A1    9/2014  Tiner et al.
2015/0225854 A1    8/2015  Madsen

* cited by examiner

FIG. 8

SHOWERHEAD SUPPORT STRUCTURES

CROSS-REFERENCE TO RELATED APPLICATION

This application claims benefit of U.S. Provisional patent application Ser. No. 62/222,173, filed Sep. 22, 2015, which is incorporated by reference herein.

BACKGROUND

Field

Embodiments of the present disclosure generally relate to supporting a gas distribution showerhead within a plasma chamber. More specifically, the disclosure relates to a support structure enabling gas flow to the chamber through the gas distribution showerhead.

Description of the Related Art

Plasma enhanced chemical vapor deposition (PECVD) is a deposition method whereby processing gas is introduced into a processing chamber through a gas distribution showerhead. The showerhead is electrically biased to ignite the processing gas into a plasma. The susceptor, sitting opposite to the showerhead, is electrically grounded and functions as an anode. The showerhead spreads out the processing gas as it flows into the processing space between the showerhead and the susceptor.

PECVD has recently become popular for depositing material onto large area substrates. Large area substrates may have a surface area of greater than about one square meter. Large area substrates may be used for flat panel displays (FPDs), solar panels, organic light emitting displays (OLEDs), and other applications. These processes require the large area substrate be subjected to temperatures on the order of 300° C. to 400° C. or higher, and maintained in a fixed position relative to the showerhead during deposition to ensure uniformity in the deposited layers.

The showerhead is generally a perforated plate supported in a spaced-apart relation above the large area substrate adapted to disperse a process gas and typically has substantially the same area as the to-be-processed substrate. Showerheads are commonly made of aluminum and are subject to expansion and contraction while enduring the temperatures during the PECVD processes. Showerheads are commonly supported around the edges and a center to maintain the processing space between the substrate and the showerhead. However, the typical showerhead support schemes may sag at elevated temperatures which may affect the processing space. Further, when gas flow is not distributed sufficiently through the showerhead during deposition, the process may not produce uniform deposition on the substrate, which may result in an unusable large area substrate.

Therefore, what is needed is an apparatus and method for supporting a gas distribution showerhead that maintains the processing space between the substrate and the gas distribution showerhead and maintains sufficient gas flow through the gas distribution showerhead.

SUMMARY

The disclosure generally relates to a method and apparatus for supporting a gas distribution showerhead in a vacuum chamber. In one embodiment, a gas distribution showerhead for a vacuum chamber includes a rectangular body having four sides, a first major surface and a second major surface opposite the first major surface, and a plurality of gas passages formed through the body in a longitudinal direction between the first and second major surfaces, a plurality of center support members coupled to the body in a center region thereof, and a plurality of mid-support members coupled to the body between the center region and the side.

In another embodiment, a gas distribution showerhead for a vacuum chamber is provided and includes a body having a first major surface and a second major surface opposite the first major surface, the body having a plurality of gas passages formed between the first major surface and the second major surface, each of the plurality of gas passages having a first opening formed in the first major surface that is fluidly coupled to a second opening formed in the second major surface by a restricting orifice, a plurality of center support members coupled to the body in a center region thereof, and a plurality of mid-support members coupled to the body between the center region and the side.

In another embodiment, a gas distribution showerhead for a vacuum chamber is provided and includes a body having a first major surface and a second major surface opposite the first major surface, the body having a plurality of gas passages formed between the first major surface and the second major surface, each of the plurality of gas passages having a first bore formed in the first major surface that is fluidly coupled to a second bore formed in the second major surface by a restricting orifice, a plurality of gas by-pass holes surrounding a gas passage of the plurality of gas passages, each of the plurality of gas by-pass holes being formed through the body from the first major surface at an angle relative to the longitudinal direction of the gas passage of the plurality of gas passages and terminating within the body to intersect with the gas passage, a center support member coupled to the body in a center region thereof by a first suspension feature, and a mid-support member coupled to the body between the center region and the side by a second suspension feature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

Embodiments of the present disclosure generally provide apparatus and methods for supporting a gas distribution showerhead in a processing chamber. In one embodiment, at least one support member coupled to a region of the gas distribution showerhead between the center and sides thereof is configured to support the gas distribution showerhead. The at least one support member is utilized to facilitate resistance to sag or bowing caused by one or a combination of gravitational forces, high processing temperatures, and negative pressure, thereby maintaining a desired horizontal profile in the gas distribution showerhead. The desired horizontal profile may be at least one of a level (e.g., planar) horizontal profile, a convex horizontal profile, or a concave horizontal profile. The desired horizontal profile may be formed or maintained, at least in part, by forces provided by the at least one support member. The horizontal profile of a gas distribution showerhead or diffuser as used herein refers to a cross-section of the gas distribution showerhead as shown in the applicable Figures. The disclosure will be described below in relation to a PECVD apparatus available from AKT America, Inc., a subsidiary of Applied Materials, Inc., Santa Clara, Calif. It is to be understood that the disclosure has applicability in other deposition chambers as well, including deposition chambers and PECVD apparatus available from other manufacturers.

Figure 1:
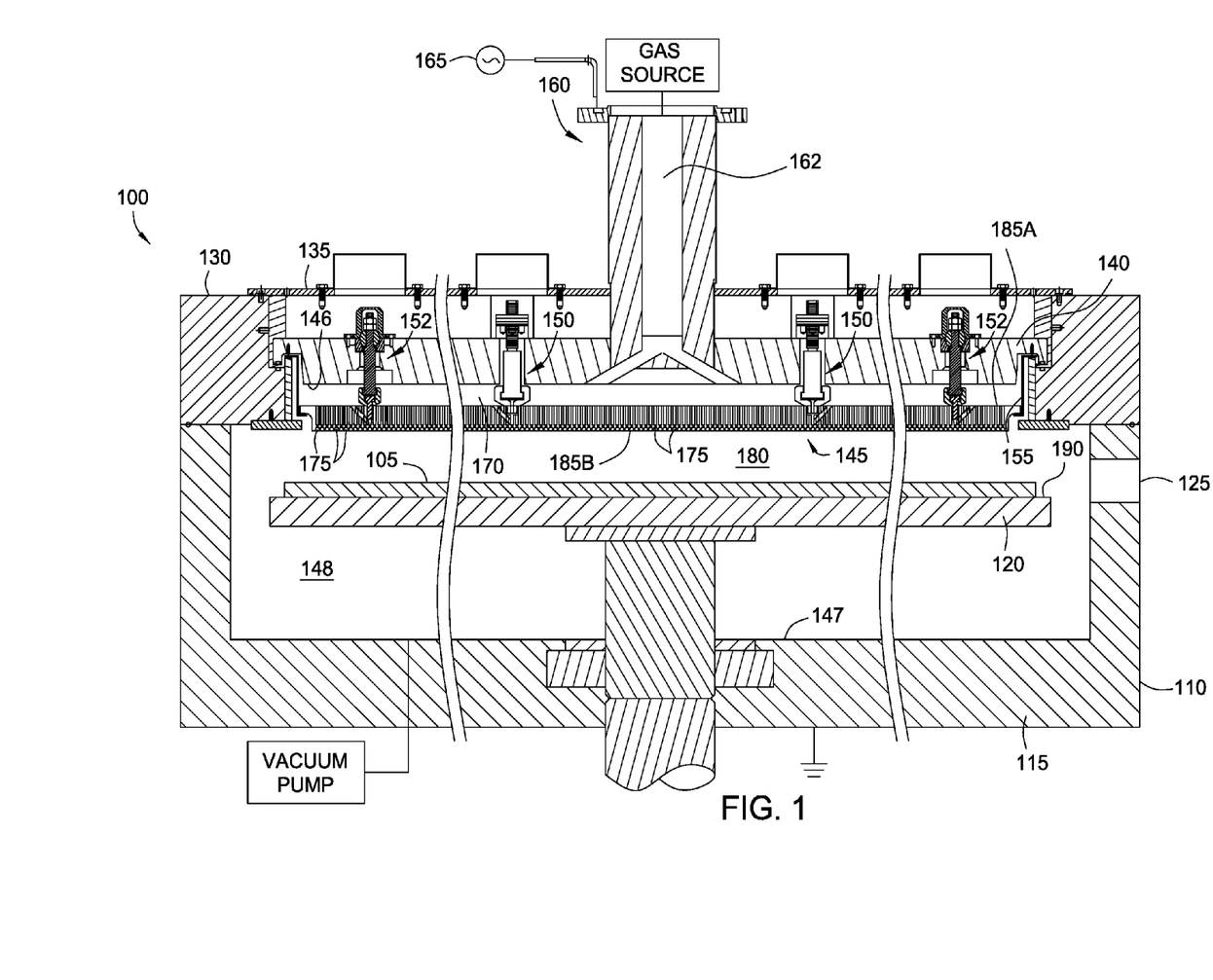
FIG. 1 is a schematic side cross-sectional view of one embodiment of a chamber.

FIG. 1 is a schematic side cross-sectional view of one embodiment of a chamber 100. The chamber 100 is suitable for plasma enhanced chemical vapor deposition (PECVD) processes for fabricating circuitry on a large area substrate 105 made of glass, a polymer, or other suitable substrate. The chamber 100 is configured to form structures and devices on the large area substrate 105 for use in the fabrication of liquid crystal displays (LCD's) or flat panel displays, photovoltaic devices for solar cell arrays, or other structures. The structures may be a plurality of back channel etch inverted staggered (bottom gate) thin film transistors which may comprise a plurality of sequential deposition and masking steps. Other structures may include p-n junctions to form diodes for photovoltaic cells.

The chamber 100 includes a chamber sidewall 110, a bottom 115, a substrate support 120, such as a susceptor, which supports the large area substrate 105 during processing. The gas distribution showerhead 145 is positioned opposite the substrate support 120 and the large area substrate 105. The chamber 100 also has a port 125, such as a slit valve, that facilitates transfer of and deposition processes on the large area substrate 105 by selectively opening and closing. The chamber 100 also includes a lid structure 130, a backing plate 140, and a gas distribution showerhead 145. In one embodiment, the lid structure 130 supports the backing plate 140 and the gas distribution showerhead 145. In one embodiment, an interior surface 146 of the backing plate 140 and an interior surface 147 of the chamber sidewall 110 bounds a variable pressure region 148. In one aspect, the chamber 100 comprises a body which includes the chamber sidewall 110, the bottom 115 and the backing plate 140 bounding the variable pressure region 148. The backing plate 140 is sealed on its perimeter by suitable o-rings at interfaces where the backing plate 140 and the lid structure 130 may contact each other. The o-rings facilitate electrical insulation as well as seal the variable pressure region 148 when negative pressure is provided by a vacuum pump coupled to the chamber 100.

In the embodiment shown, the gas distribution showerhead 145 is supported by the backing plate 140 at a central region thereof by one or more center support members 150. Outbound of the center support members 150 is one or more middle support members or mid-support members 152 that may be used alone or in addition to the center support members 150. The term "center" in reference to support members as described herein may be defined as a region about a geometric center of the gas distribution showerhead 145 and/or the backing plate 140. Likewise, the term "middle" in reference to support members as described herein may be defined as a region between the "center" region and a peripheral edge of the gas distribution showerhead 145 and/or the backing plate 140.

The one or more center support members 150 and/or the mid-support members 152 facilitate support of the gas distribution showerhead 145 to control the horizontal profile of the gas distribution showerhead 145. The one or more center support members 150 and/or the mid-support members 152 may also be utilized to mitigate the tendency of the gas distribution showerhead 145 to droop or sag due to one or a combination of heat, gravity and vacuum. The gas distribution showerhead 145 may also be supported at a perimeter thereof by a flexible suspension 155. The flexible suspension 155 is adapted to support the gas distribution showerhead 145 from its edges and to allow lateral expansion and contraction of the gas distribution showerhead 145.

The chamber 100 is coupled to a gas inlet 160 that is coupled to a gas source and a plasma source 165. The plasma source 165 may be a direct current power source, a radio frequency (RF) power source, or a remote plasma source. The RF power source may be inductively or capacitively coupled to the chamber 100. The gas inlet 160 delivers process or cleaning gases from the gas source through a bore 162 to an intermediate region 170 defined between the backing plate 140 and the gas distribution showerhead 145.

In one example of operation, process gases are delivered from the gas source while the interior of the chamber 100 has been pumped down to a suitable pressure by the vacuum pump. One or more process gases flow through the gas inlet 160 to the intermediate region 170 defined between the backing plate 140 and the gas distribution showerhead 145. The one or more process gases then flow from the intermediate region 170 through a plurality of openings or gas passages 175 formed through the gas distribution showerhead 145 to a processing region 180 defined in an area below the gas distribution showerhead 145 and above the substrate support 120.

The large area substrate 105 is raised from a transfer position to the processing region 180 by moving the substrate support 120 toward the gas distribution showerhead 145. The height of the processing region 180 may be varied as a process parameter based on a spacing between a lower surface of the gas distribution showerhead 145 and a substrate receiving surface 190 of the substrate support 120. The substrate support 120 may be heated by an integral heater, such as heating coils or a resistive heater coupled to or disposed within the substrate support 120.

A plasma may be formed in the processing region 180 by the plasma source 165 coupled to the chamber 100. The plasma excited gas is deposited thereon to form structures on the large area substrate 105. In one embodiment, the substrate support 120 is at ground potential to facilitate plasma formation in the processing region 180. A plasma may also be formed in the chamber 100 by other means, such as a thermally induced plasma. Although the plasma source 165 is shown coupled to the gas inlet 160 in this embodiment, the plasma source 165 may be coupled to the gas distribution showerhead 145 or other portions of the chamber 100.

The gas distribution showerhead 145 is made of or coated with an electrically conductive material and is coupled to the plasma source 165 through the gas inlet 160 or other connection so that it may function as a first electrode within the chamber 100. The materials chosen for the gas distribution showerhead 145 may include steel, titanium, aluminum, or combinations thereof, and the surfaces may be polished or anodized. The gas distribution showerhead 145 may include a first major surface or upper surface 185A and a second major surface or lower surface 185B. In one embodiment, the upper surface 185A and the lower surface 185B are substantially parallel in cross-section. In another embodiment, at least one of the upper surface 185A and the lower surface 185 6 may be curved in cross-section to define a concave surface. In another embodiment, at least one of the upper surface 185A and the lower surface 185B are curved to define a convex surface. In another embodiment, at least one of the upper surface 185A and the lower surface 185B are non-parallel.

In one embodiment, the gas distribution showerhead 145 may include a thickness or cross-sectional dimension that is thicker at a perimeter and thinner at a center thereof to form a dished or "scooped" lower surface 185B. In this embodiment, at least the upper surface 185A is substantially planar or level. Thus, the thicker cross-sectional dimension at the perimeter of the gas distribution showerhead 145 relative to the center of the gas distribution showerhead 145 forms a desired horizontal profile that is concave relative to the horizontal profile of the substrate support 120. In another embodiment, the substrate receiving surface 190 of the substrate support 120 is substantially planar and the lower surface 185B of the gas distribution showerhead 145 is concave relative to the substrate receiving surface 190.

Figure 2:
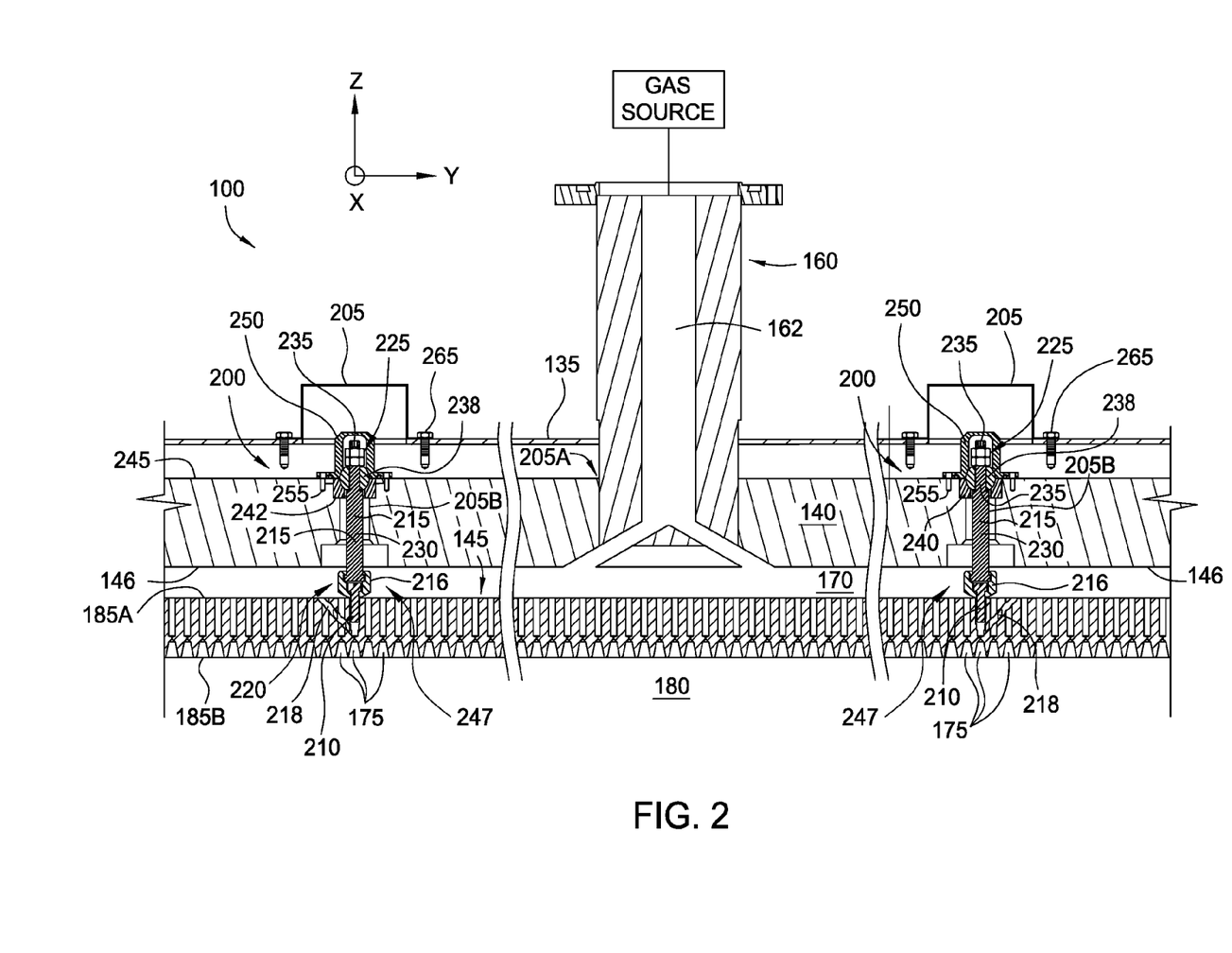
FIG. 2 is an enlarged partial cross-sectional view of the chamber of FIG. 1.

FIG. 2 is an enlarged partial cross-sectional view of the chamber 100 of FIG. 1. The backing plate 140 includes a plurality of openings extending therethrough, such as first opening 205A and one or more second openings 205B. In one embodiment, the first opening 205A is adapted to receive the gas inlet 160 and the one or more second openings 205B are configured to receive a respective support member 200. The support members 200 may be the center support members 150 or the mid-support members 152 of FIG. 1. In one embodiment, the first opening 205A is located at a substantial geometric center of the backing plate 140, although the first opening 205A may be positioned elsewhere. In embodiments where a cover plate 135 is utilized, the cover plate 135 contains through holes to receive the gas inlet 160 and the support members 200. An optional cooling plate (not shown), may be positioned above the cover plate 135. The optional cooling plate may have openings that receive a portion of a cover 205 that may be coupled to the cover plate 135. The cover 205 may be fastened to the cover plate 135 by one or more fasteners 265.

The support members 200 include a first support member 215 that detachably couples to a second support member, such as a suspension fitting 220. The suspension fitting 220 according to this embodiment includes a fastener 210 that couples an interface body 216 of the suspension fitting 220 to the gas distribution showerhead 145. The fastener 210 may be disposed in a respective gas passage 175 such that the gas passages 175 utilized are obstructed. To facilitate gas flow from the upper surface 185A to the lower surface 185B of the gas distribution showerhead 145, an alternative gas passage 218 may be utilized. The alternative gas passage 218 may include a diameter that is substantially equal to a diameter of the gas passages 175.

The support members 200 may be detachably coupled to the suspension fitting 220 in any suitable manner, such as by mating bayonet fasteners, mating threaded portions, mating quarter-turn fasteners and the like. In the embodiment depicted in FIG. 2, the first support member 215 includes a shaft 230 at a first end thereof and a threaded portion 235 at a second end thereof. The threaded portion 235 is adapted to couple to a support nut assembly 225. The support nut assembly 225 may include a first nut and a second nut utilized as a locking nut. The support nut assembly 225 is adapted to rotate relative to the threaded portion 235 and a pivoting structure 238. The pivoting structure 238 is adapted to contact a ball seat 240. The ball seat 240 is disposed in a recess 242 formed in an upper surface 245 of the backing plate 140. The pivoting structure 238 and the ball seat 240 allows the gas distribution showerhead 145 to move laterally (X and/or Y directions) relative to the backing plate 140 in order to facilitate expansion and contraction of the gas distribution showerhead 145 during use.

The combination of the suspension fitting 220 fastened to the gas distribution showerhead 145 by the fastener 210, the shaft 230 being coupled to the interface body 216, and the shaft 230 being coupled to the pivoting structure 238 that allows support members 200 to mate with the gas distribution showerhead 145 in a manner that allows the gas distribution showerhead 145 to be pulled normally upward (Z direction) or suspended by, the backing plate 140, by a force applied by the support nut assembly 225. The force applied by the support nut assembly 225 of the support members 200 to the gas distribution showerhead 145 may simply counter-act the force of gravity acting upon the gas distribution showerhead 145. Alternatively, the support members 200 may be utilized to adjust the horizontal profile of the gas distribution showerhead 145 relative to the backing plate 140 (i.e., height or spacing therebetween).

The backing plate 140 is relatively thicker in cross-section than the gas distribution showerhead 145. The gas distribution showerhead 145 is more flexible relative the backing plate 140 due to relative thickness and the perforations in the gas distribution showerhead 145. The backing plate 140 is configured to be stiffer than the gas distribution showerhead 145, thus being less affected by forces such as gravity, vacuum, and heat. The backing plate 140 may deflect due to these forces, but not to the degree that may be experienced by the gas distribution showerhead 145. Thus, the gas distribution showerhead 145 may experience some deformation caused by the aforementioned forces, but the deformation is effectively limited by stiffness of the backing plate 140 and the support members 200 positioned therebetween.

Thus, sag or deformation in the gas distribution showerhead 145 and/or backing plate 140 may be predetermined and counteracted by adjustment of the support nut assembly 225.

Rotation of the support nut assembly 225 against the surface of the pivoting structure 238 raises or lowers the shaft 230, the suspension fitting 220 and gas distribution showerhead 145 relative to the backing plate 140, thus controlling the horizontal profile of the gas distribution showerhead 145. In one embodiment, the first end of the shaft 230 includes a coupling mechanism 247 that facilitates coupling and decoupling of the first support member 215 and the interface body 216 of the suspension fitting 220.

A cap 250 is disposed over each of the support nut assemblies 225 to facilitate vacuum sealing around the second openings 205B. The cap 250 may be coupled to the upper surface 245 of the backing plate 140 by fasteners 255. Seals (not shown in this view), such as o-rings, may be disposed between the upper surface 245 of the backing plate 140 inward of the fasteners 255.

Figure 3:
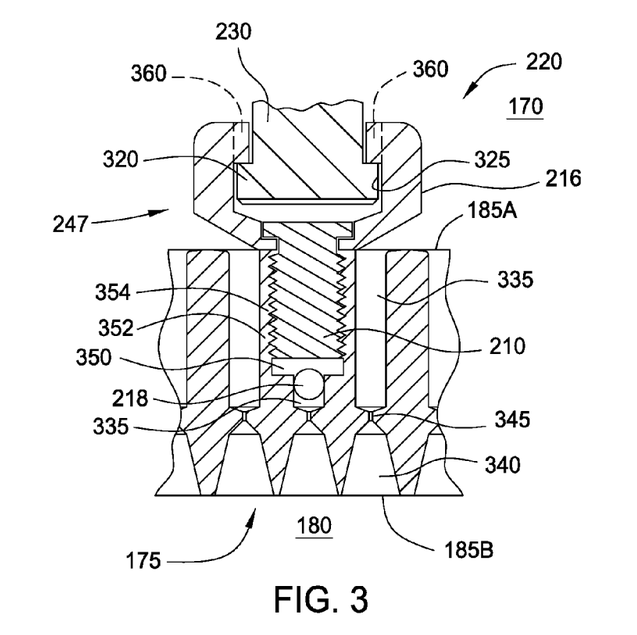
FIG. 3 is an enlarged cross-sectional view of one embodiment of a suspension fitting disposed in a gas distribution showerhead 145.

FIG. 3 is an enlarged cross-sectional view of one embodiment of a suspension fitting 220 disposed in a gas distribution showerhead 145. In one embodiment, the gas distribution showerhead 145 includes a plurality of gas passages 175 having a first bore 335 extending from the upper surface 185A to the lower surface 185B of the gas distribution showerhead 145. The first bore 335 is coupled to at least a second bore 340 fluidly coupled to the first bore 335. The second bore 340 may be flared in the form of a cone or frustum. In some embodiments, the first bore 335 and the second bore 340 are coupled by a restricting orifice 345 having a diameter that is less than a diameter of the first bore 335 and the second bore 340.

The suspension fitting 220 may be disposed in an enlarged second bore 350 having a diameter greater than the diameter of the first bore 335 but is less than a pitch or distance between adjacent first bores 335. Thus, a wall 352 is maintained between an adjacent first bore 335 and the enlarged second bore 350 allowing a threaded portion 354 of the fastener 210 to be coupled to mating threads formed in the gas distribution showerhead 145. In one aspect, utilization of the suspension fitting 220 creates two types of gas passages 175 in the gas distribution showerhead 145, for example a first type that is obstructed by the presence of the suspension fitting 220 and a second type that is unobstructed. Thus, the gas passages 175 that do not include a suspension fitting 220 provide unobstructed flow of gas from the intermediate region 170 to the processing region 180 while gas flow through the gas passages 175 having the suspension fitting 220 disposed therein may be at least partially blocked by the presence of the suspension fitting 220. To provide gas to the obstructed gas passage 175 having the suspension fitting 220 disposed therein, the alternative gas passage 218 is utilized. The alternative gas passage 218 is utilized to allow gases to flow from the intermediate region 170 to the first bore 335 below the fastener 210. Thus, gas may be provided around the suspension fitting 220 to the second bore 350, and through the restricting orifice 345 to the processing region 180.

The coupling mechanism 247 of the support member 200 is more clearly shown in this view. In one aspect, the coupling mechanism 247 comprises a slot/key device which provides a detachable interface comprising one or more keys 320 disposed on a distal end of the shaft 230 that mate with a respective slot 325 formed in the suspension fitting 220. The coupling mechanism 247 allows the first support member 215 to be rotated to couple and decouple with the suspension fitting 220 providing removal of the first support member 215 from the suspension fitting 220. Gaps 360 (shown in phantom) formed in the interface body 216 provide for removal of the shaft 230 when rotated, as will be explained in greater detail below.

Figures 4A, 4B:
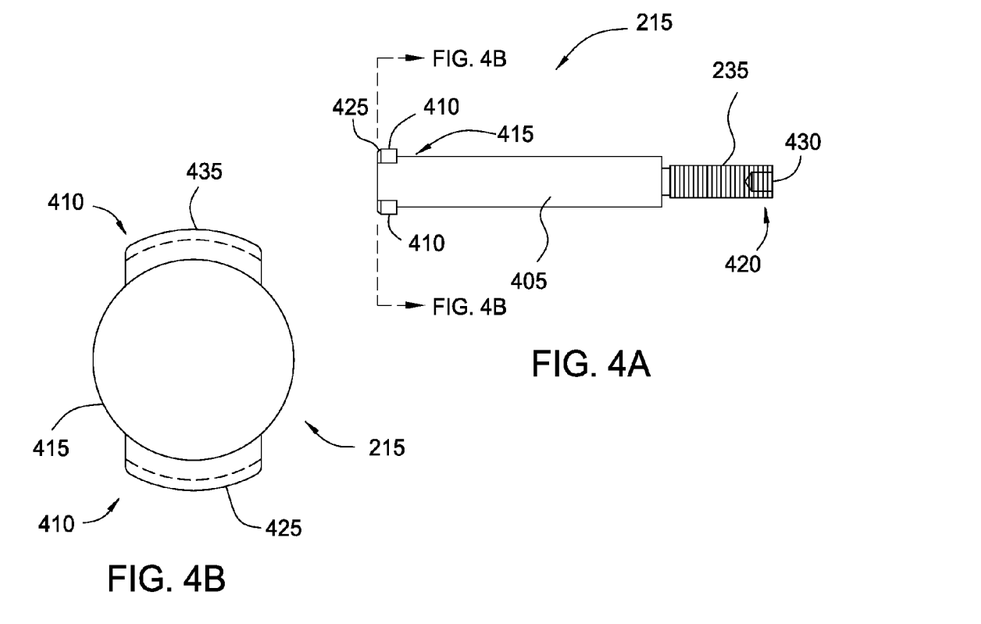
FIG. 4A is a side view of one embodiment of a support member.
FIG. 4B is a plan view of the support member of FIG. 4A.

FIG. 4A is a side view of one embodiment of a first support member 215. The first support member 215 includes a support body 405 that in one embodiment includes a circular cross-section. The support body 405 includes one or more key portions 410 extending radially outward from the support body 405 at a first end 415 and a threaded portion 235 on a second end 420 opposite the first end 415. At least a portion of the first end 415 is sized to be inserted into the suspension fitting 220 (FIGS. 2-3) while the threaded portion 235 is adapted to be received by the support nut assembly 225 (FIG. 2). In one embodiment, the first end 415 includes a taper 425, which may be a bevel or a radius, to facilitate insertion into the suspension fitting 220. The second end 420 may also include a tool interface 430 to facilitate rotational control of the first support member 215 utilized in tightening and/or loosening the support nut assembly 225. The tool interface 430 may be a female opening adapted for a hex key, a square key, a TORX® wrench, among other types of screw drive configurations.

FIG. 4B is a plan view of the first support member 215 of FIG. 4A. The key portions 410 include an outer dimension, such as an outer diameter 435, which is sized to be inserted and to rotate within an interior channel of the suspension fitting 220.

Figure 5A:
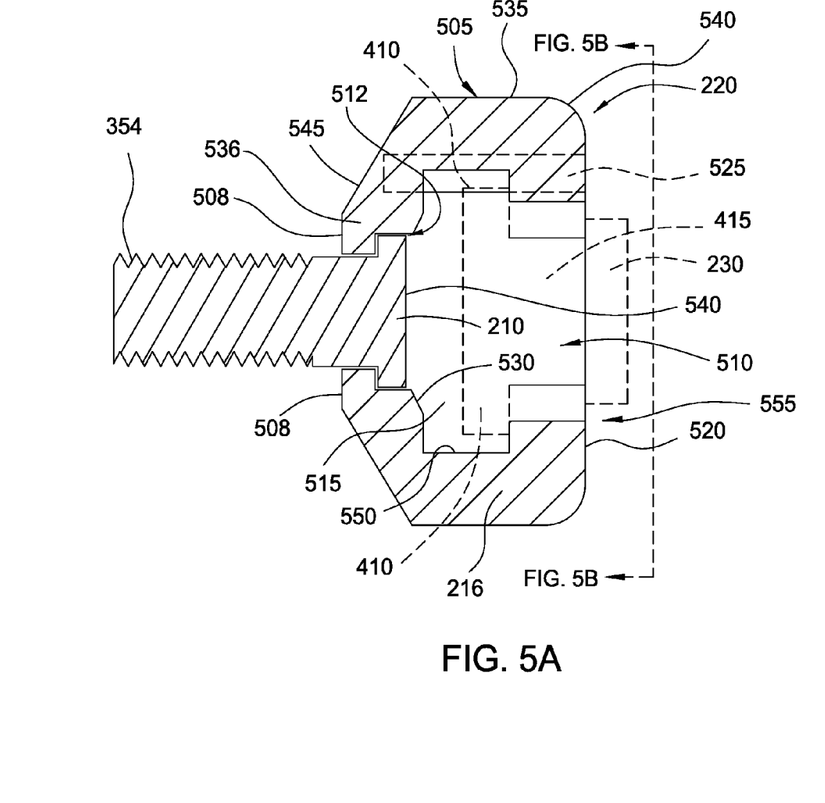
FIG. 5A is a side cross-sectional view of one embodiment of a suspension fitting.

FIG. 5A is a side cross-sectional view of one embodiment of a suspension fitting 220 having a shaft 230 (shown in phantom) of a first support member 215 disposed therein. The suspension fitting 220 includes a circular support body 505 (the interface body 216) that tapers to a planar portion 508. An exterior taper 545 may be included between a planar surface 535 of the support body 505 and the planar portion 508. The support body 505 contains a central opening 510 that may include an interior channel 515 and a fastener opening 512 formed through the planar portion 508. The interior channel 515 is at least partially contained by a surface of the central opening 510 and a lip 520 that circumscribes a portion of the diameter of the central opening 510. the interior channel 515 may be surrounded by a sidewall 550. In one embodiment, the threaded portion 354 of the fastener 210 comprises a first mating mechanism, for example a male mating mechanism while the central opening 510 and the lip 520 comprises a second mating mechanism, such as a female mating mechanism adapted to receive the first end 415 of the first support member 215. The first end 415 of the first support member 215 is adapted to rotate in the interior channel 515. In one embodiment, the lip 520 bounding the central opening 510 comprises a slotted receptacle 555 adapted to receive and mate with the key portions 410 of the first support member 215.

Figure 5B:
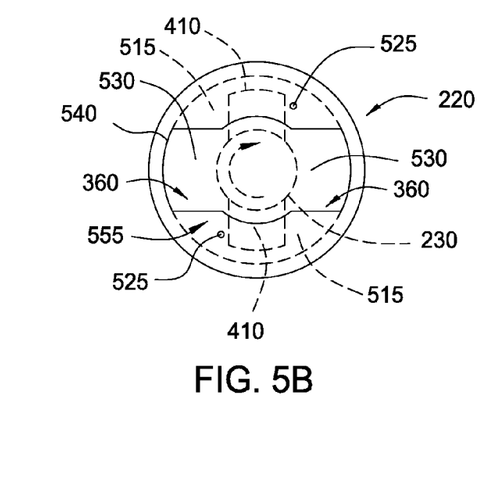
FIG. 5B is a top view of the suspension fitting shown in FIG. 5A.

The support body 505 also includes at least one pin 525 (two are shown in FIG. 5B) that is configured to function as a stop for the key portions 410 of the threaded support member 215 and/or to limit rotation of the first support member 215 after installation. The pins 525 may be positioned longitudinally as shown, or the pins may be coupled to support body 505 perpendicular to the longitudinal axis of the suspension fitting 220. The center of the support body 505 includes the central opening 510 that is adapted to receive a portion of the shaft 230. In this embodiment, the shaft 230 of the threaded support member 215 is in a secured position such that key portions 410 are in contact with the lip 520 of the suspension fitting 220 and facilitate support of the gas distribution showerhead 145 from the backing plate 140

(both shown in FIGS. 1-2). A tool including at least one feature similar to a key portion 410 may also be inserted into the central opening 510 to facilitate rotation and tightening of the suspension fitting 220 and when installing the suspension fitting 220 on the gas distribution showerhead 145.

In one embodiment, the central opening 510 includes a conical recess or tapered surface 530 from the interior channel 515 toward the fastener 210. In one embodiment, the fastener 210 comprises a head portion 540 at a first end thereof and the threaded portion 354 at a second end thereof. The head portion 540 includes a greater dimension or diameter relative to the diameter of the threaded portion 354 as well as the opening 512. In one embodiment, the head portion 540 includes a first diameter and the threaded portion 354 includes a second diameter that is less than the first diameter. A shoulder 536 is formed in the opening 512 between the planar portion 508 and the head portion 540. The head portion 540 may include a tool interface (not shown) for a tool, such as a hex key, a square key, a TORX® wrench, among other types of screw drive configurations.

FIG. 5B is a top view of the suspension fitting 220 shown in FIG. 5A. The key portions 410 are shown in phantom below the lip 520 such that the threaded support member 215 is in a secured position with the suspension fitting 220. A gap 360 on opposing sides of the shaft 230 is shown exposing a portion of the tapered surface 530 of the suspension fitting 220. The gap 360 allows space for the key portions 410 to be inserted into the central opening 510.

Figure 5C:
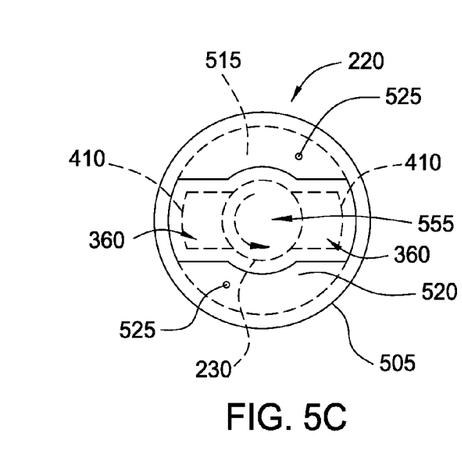
FIG. 5C is a top view of the suspension fitting shown in FIG. 5B.

FIG. 5C is a top view of the suspension fitting 220 shown in FIG. 5B. In this embodiment, the shaft 230 is shown in phantom in a removal position. The shaft 230 is rotated about 45° to allow the key portions 410 to align with an opening between opposing sides of the lip 520. The threaded support member 215 may be removed from the central opening 510 of the suspension fitting 220 as the key portions 410 are aligned as shown in FIG. 5C.

Figure 6:
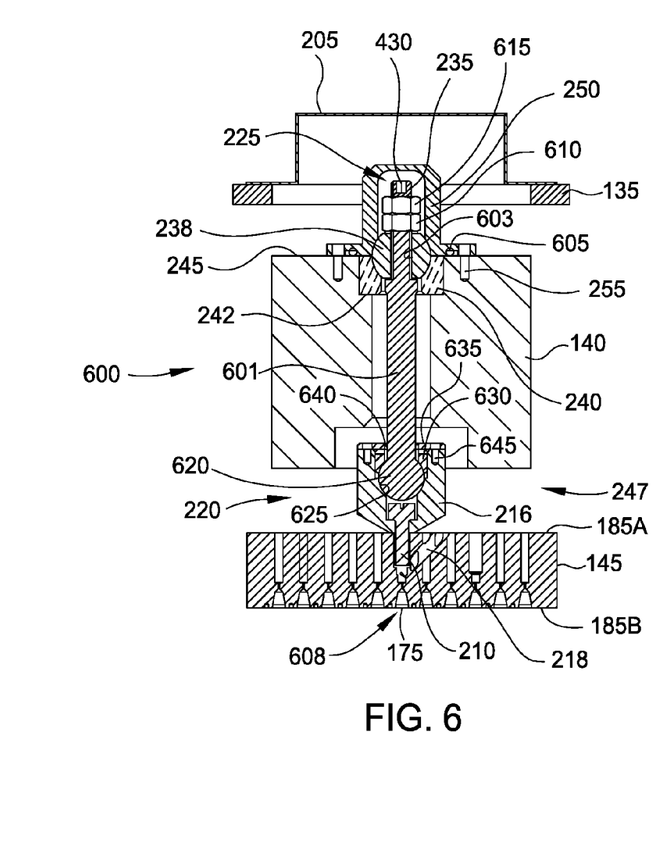
FIG. 6 is a cross-sectional view of another embodiment of a support member coupled between a backing plate and a gas distribution showerhead.

FIG. 6 is a cross-sectional view of another embodiment of a support member 600 coupled between a backing plate 140 and a gas distribution showerhead 145. The support member 600 may be the support members 200 of FIG. 2, or one or both of the center support members 150 and the mid-support members 152 of FIG. 1.

The support member 600 includes a threaded support member 601 that is coupled to a coupling mechanism 247, which in turn is coupled to the gas distribution showerhead 145. The support member 600 includes a pivoting structure 238 and a ball seat 240 similar to the support members 200 shown in FIG. 2. The pivoting structure 238 includes a central opening 603 formed therein which receives a portion of the threaded support member 601. The pivoting structure 238 and the ball seat 240 are enclosed by a cap 250. The cap 250 is coupled to the backing plate 140 by one or more fasteners 255. A seal 605, such as an o-ring, is disposed between the ball seat 240 and the fasteners 255 in order to facilitate vacuum sealing.

The support nut assembly 225 is coupled to a threaded portion 235 of the threaded support member 601. The support nut assembly 225 according to this embodiment includes at least a first nut 610 that contacts a surface of the pivoting structure 238 when rotated to tighten onto the threaded portion 235. In some embodiments, the support nut assembly 225 includes a second nut 615 that may be used as a locking nut in conjunction with the first nut 610.

The coupling mechanism 247 according to this embodiment comprises an interface body 216 that is coupled to the gas distribution showerhead 145 by a fastener 210, similar to the coupling mechanism 247 described in FIG. 3. However, in this embodiment, the coupling mechanism 247 includes a pivoting structure 620 instead of the slot/key configuration described in FIGS. 3-5B. A fastener 210 may be disposed in a gas passage 175 of the gas distribution showerhead 145 to form an obstructed gas passage 608. A gas by-pass hole or an alternative gas passage 218 may be utilized to provide gas flow from the upper surface 185A to the lower surface 185B of the gas distribution showerhead 145.

The pivoting structure 620 may be formed at an end of the threaded support member 601 opposing the threaded portion 235 thereof. The pivoting structure 620 may be at least partially received in a ball seat 625 formed in the interface body 216 of the suspension fitting 220. A bushing 630 may be disposed between a cover 635 and the pivoting structure 620. The cover 635 includes an opening 640 that receives a diameter of the threaded support member 601. The cover 635 may be fastened to the interface body 216 by one or more fasteners 645. Thus, the pivoting structure 620 and the bushing 630 may be secured to the interface body 216 in order to couple the threaded support member 601 to the gas distribution showerhead 145. The pivoting structure 620 and the ball seat 625 allows the gas distribution showerhead 145 to move laterally (X and/or Y directions) relative to the backing plate 140 in order to facilitate expansion and contraction of the gas distribution showerhead 145 during use.

Figure 7:
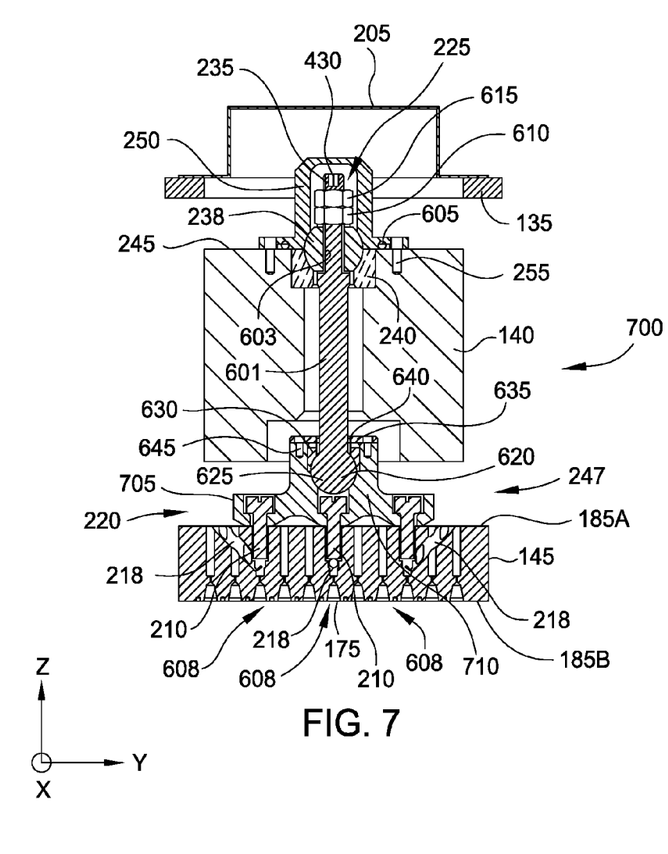
FIG. 7 is a cross-sectional view of another embodiment of a support member coupled between a backing plate and a gas distribution showerhead.

FIG. 7 is a cross-sectional view of another embodiment of a support member 700 coupled between a backing plate 140 and a gas distribution showerhead 145. The support member 700 may be the support members 200 of FIG. 2, or one or both of the center support members 150 and the mid-support members 152 of FIG. 1.

The support member 700 is similar to the support member 600 shown in FIG. 6 with the following exception. The interface body 216 according to this embodiment includes one or more extended sections 705 extending from a central body 710. A fastener 210 may be disposed through respective openings in each of the central body 710 and the extended sections 705. Additionally, each fastener 210 may be disposed in a respective gas passage 175 of the gas distribution showerhead 145 to form an obstructed gas passage 608. At least one alternative gas passage 218 may be utilized to provide gas flow from the upper surface 185A to the lower surface 185B of the gas distribution showerhead 145.

In the embodiments of the support member 600 and 700 described in FIGS. 6 and 7, the pivoting structure 620 may be replaced by the slot/key configuration described in FIGS. 3-5B.

Figure 8:
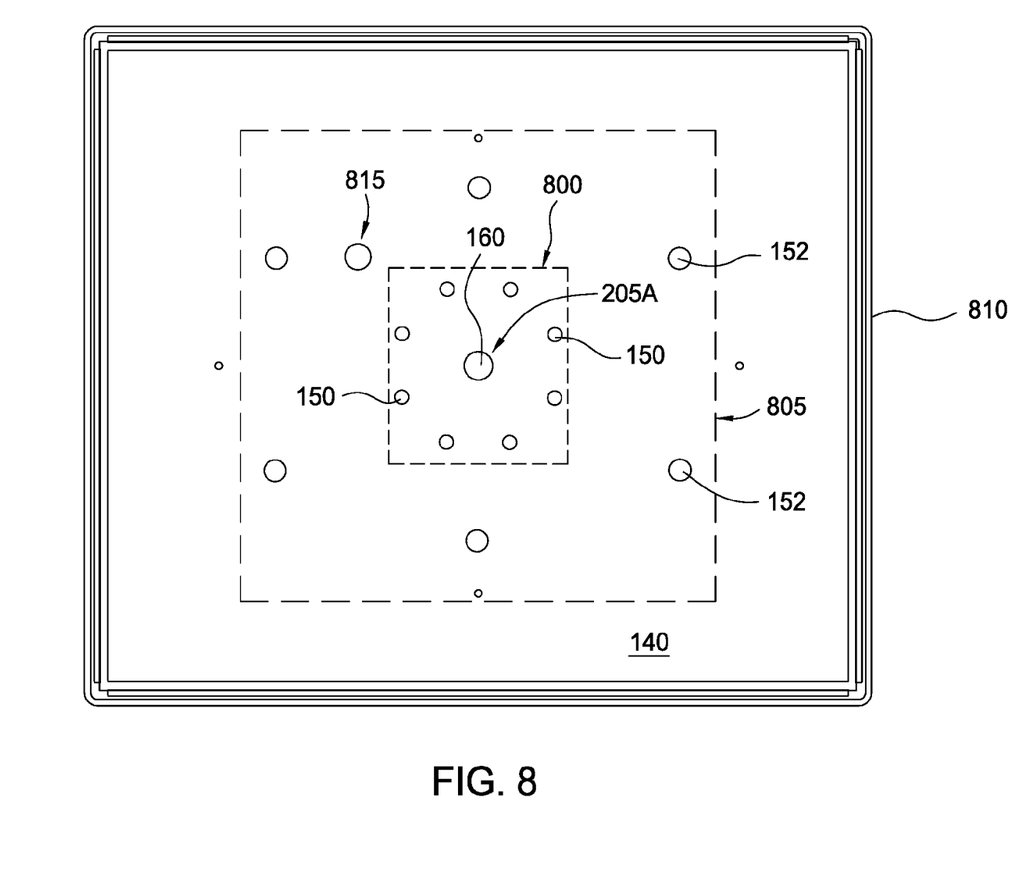
FIG. 8 is a plan view of one embodiment of a backing plate that may be utilized in the chamber of FIG. 1.

FIG. 8 is a top plan view of one embodiment of a backing plate 140. In this embodiment, a center area 800 is shown on the backing plate 140 and a pattern of center support members 150 are depicted within the center area 800. The backing plate 140 also includes a middle support area 805 and a pattern of mid-support members 152 within the middle support area 805. The center area 800 may be any centrally located area of the backing plate 140 and gas distribution showerhead 145 that is determined as a support point for the gas distribution showerhead 145. The middle support area 805 may be an area between the center area 800 and an edge 810 of the backing plate 140. A gas distribution showerhead 145, which is not shown in this view, is typically located below the backing plate 140 and has dimensions substantially equal to the dimensions of backing plate 140. Thus, the gas distribution showerhead 145 has a corresponding center area that may allow any of the elements depicted in the backing plate 140 to mate with the gas distribution showerhead 145.

Although eight center support members 150 are shown in a symmetrical pattern in this embodiment, the plurality of center support members 150 may be of any pattern, number, and size in the center area 800 of the backing plate 140. Likewise, while six mid-support members 152 are shown in the middle support area 805, the plurality of mid-support members 152 may be of any pattern, number, and size in the middle support area 805 of the backing plate 140. Also shown is a first opening 205A in the backing plate 140 that is adapted to receive the gas inlet 160 to supply a gas to the gas distribution showerhead 145 (which may be located below the backing plate 140 in this view). An alternative gas introduction port 815 is also shown and may be used to provide process gases to the gas distribution showerhead 145 alone or in combination with the gas inlet 160. Additional gas introduction ports (not shown) may also be utilized to deliver gases through the backing plate 140 to the gas distribution showerhead 145.

Figure 9:
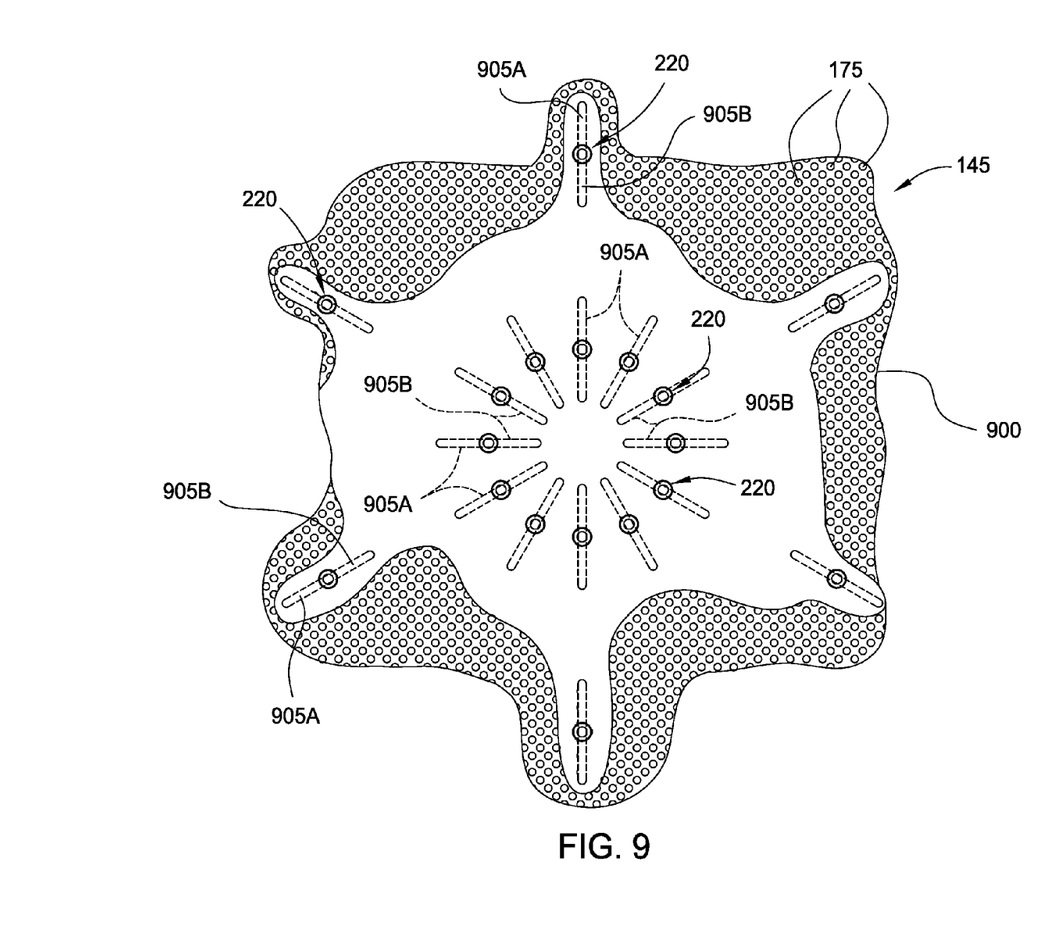
FIG. 9 is a schematic bottom view of a portion of one embodiment of a gas distribution showerhead according to embodiments described herein.

FIG. 9 is a schematic bottom view of a portion of one embodiment of a gas distribution showerhead 145. The gas distribution showerhead 145 includes a plurality of outer gas by-pass holes 905A and inner gas by-pass holes 905B that are shown in phantom in a body 900 of the gas distribution showerhead 145. The outer gas by-pass holes 905A and inner gas by-pass holes 905B correspond to the alternative gas passages 218 shown in FIG. 2 as well as other Figures. The enlarged second bore 350 intersecting with the gas by-pass holes 905A, 905B are not shown in FIG. 9. The gas by-pass holes 905A, 905B may be formed in a substantially symmetrical pattern in the gas distribution showerhead 145 to provide symmetrical gas flow to a obstructed gas passage 608 (shown in FIGS. 6 and 7). The symmetrical pattern is not limited to the pattern shown. The outer gas by-pass holes 905A may be utilized exclusively or in conjunction with the inner gas by-pass holes 905B. Likewise, the inner gas by-pass holes 905B may be utilized exclusively or in conjunction with the outer gas by-pass holes 905A. While an outer gas by-pass hole 905A and an inner gas by-pass hole 905B is shown corresponding to each suspension fitting 220, the number of gas by-pass holes 905A, 905B per suspension fitting 220 may be less than two per suspension fitting 220. In one embodiment, a plurality of outer gas by-pass holes 905A may alternate with each suspension fitting 220. Alternatively or additionally, a plurality of inner gas by-pass holes 905B may alternate with the plurality of outer gas by-pass holes 905A and/or each suspension fitting 220.

Figure 10A:
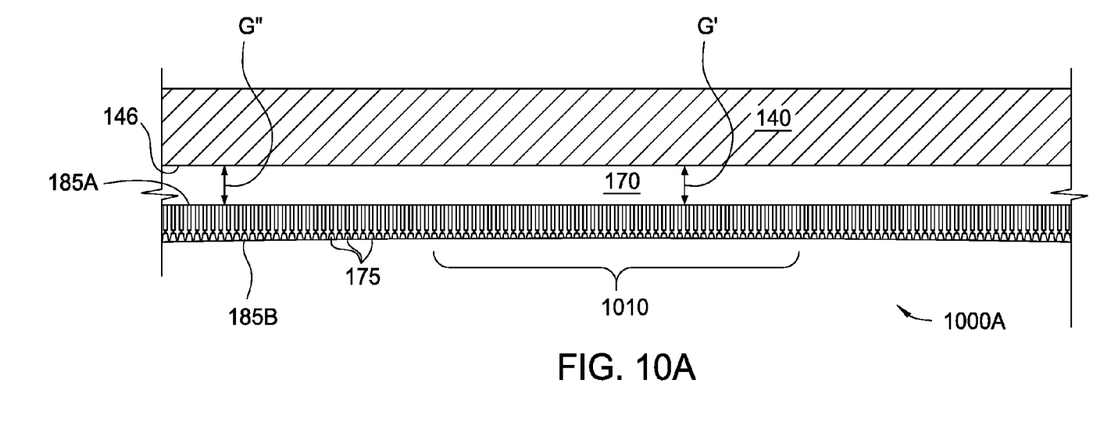
FIGS. 10A and 10B are schematic partial cross-sectional views of alternative embodiments of a gas distribution showerhead.
Figure 10B:
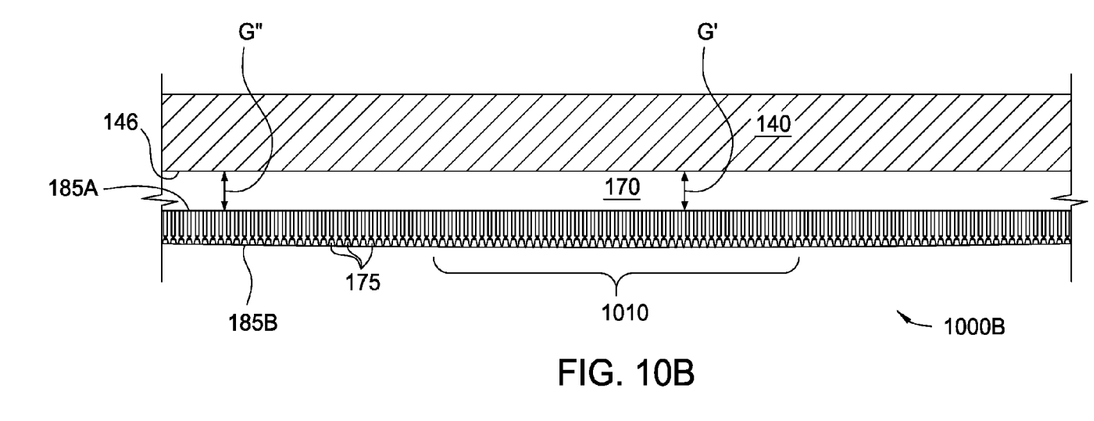

FIGS. 10A and 10B are schematic partial cross-sectional views of embodiments of a gas distribution showerhead 1000A and 1000B, respectively. FIG. 10A shows a center area 1010 of the backing plate 140 and the gas distribution showerhead 1000A in a concave horizontal profile relative to the backing plate 140. Thus, in this embodiment, the lower surface 185B of the gas distribution showerhead 1000A is non-parallel or dished relative to the horizontal orientation of the backing plate 140. In one embodiment, a first space gap G' is contained between the interior surface 146 of the backing plate 140 and the upper surface 185A in the center area 1010 of the gas distribution showerhead 1000A while a second space gap G" is contained between the interior surface 146 of the backing plate 140 and the upper surface 185A in the perimeter of the gas distribution showerhead 1000A.

The first space gap G' may be adjusted by adjusting one or more of the center support members 150 and/or the mid-support members 152 (both not shown in FIGS. 10A and 10B). Adjustment off the center support members 150 and/or the mid-support members 152 may be utilized to push the gas distribution showerhead 1000A, 1000B away from the backing plate 140 or pull the gas distribution showerhead 1000A, 1000B toward the backing plate 140 to control the horizontal profiles of the gas distribution showerhead 1000A, 1000B. The first space gap G' and second space gap G" may be maintained or adjusted to be substantially equal or different. In one example, the first space gap G' and second space gap G" are substantially equal. In another example, the first space gap G' may be less than the second space gap G". In one embodiment, the gas passages 175 have a greater length at the perimeter of the gas distribution showerhead 1000A relative to the gas passages 175 at the center of the gas distribution showerhead 1000A. In one aspect, the flared bores of each of the gas passages 175 include a greater length at a center of the gas distribution showerhead 1000A and the length gradually increases from the center of the gas distribution showerhead 1000A to the perimeter of the gas distribution showerhead 1000A.

FIG. 10B shows a center area 1010 of the backing plate 140 and the gas distribution showerhead 1000B in a convex horizontal profile relative to the backing plate 140. While not shown, the first space gap G' and second space gap G" are contained between the interior surface 146 of the backing plate 140 and the upper surface 185A of the gas distribution showerhead 1000B. The first space gap G' and second space gap G" may be maintained or adjusted as described with reference to FIG. 10A. In one embodiment, the first space gap G' and second space gap G" are substantially equal. In another example, the second space gap G" may be less than the first space gap G'. In one embodiment, the gas passages 175 have a greater length at the center of the gas distribution showerhead 1000B relative to the gas passages 175 at the perimeter of the gas distribution showerhead 1000B. In one aspect, the flared bores of each of the gas passages 175 include a greater length at the center of the gas distribution showerhead 1000B and the length gradually decreases from the center of the gas distribution showerhead 1000B to the perimeter of the gas distribution showerhead 1000B.

An apparatus and method for supporting a gas distribution showerhead that maintains the processing space between the substrate and the gas distribution showerhead and does not interfere with gas flow through the gas distribution showerhead is described. The apparatus includes one or more center support members 150 and/or mid-support members 152 that maintain and/or provide manipulation the cross-sectional curvature or horizontal profile of the gas distribution showerhead 145. The gas distribution showerhead 145 may be manipulated to present a horizontal profile that is one of planar, convex, or concave. The horizontal profile of the gas distribution showerhead 145 may be adjusted relative a substrate support 120 and/or a backing plate 140 in a chamber. The embodiments of the center support members 150 as described herein also does not interfere with gas flow thereby facilitating deposition at locations of the substrate adjacent the center support members 150 and/or the mid-support members 152.

While the foregoing is directed to embodiments of the present disclosure, other and further embodiments of the disclosure may be devised without departing from the basic scope thereof, and the scope thereof is determined by the claims that follow.

The invention claimed is:
1. An apparatus, comprising:
a gas distribution showerhead comprising a rectangular body having four sides, a first major surface and a second major surface opposite the first major surface, and a plurality of gas passages formed through the body in a longitudinal direction between the first and second major surfaces;
a plurality of center support members coupled to the body in a center region thereof; and
a plurality of mid-support members coupled to the body between the center region and one of the four sides, wherein at least a portion of one or both of the center support members and mid support members comprise a suspension feature, the suspension feature comprising an interface body located outside of the gas distribution showerhead, wherein the interface body includes an opening which receives a fastener which is disposed in a first gas passage of the plurality of the gas passages.

2. The apparatus of claim 1, wherein each of the plurality of gas passages comprises a first bore formed in the first major surface that is fluidly coupled to a second bore formed in the second major surface by an orifice hole.

3. The apparatus of claim 2, wherein a second gas passage is formed through the body in an inclined angle relative to the longitudinal direction of the first gas passage that intersects with the first bore of the first gas passage.

4. The apparatus of claim 1, wherein at least a portion of one or both of the center support members and the mid-support members includes a pivoting structure providing lateral movement of the body.

5. The apparatus of claim 4, wherein at least a portion of one or both of the center support members and the mid-support members includes a slot/key device that couples to the suspension feature.

6. The apparatus of claim 5, wherein the suspension feature comprises one or more extended sections coupled to the interface body.

7. The apparatus of claim 1, wherein the interface body comprises a circular body with an exterior taper.

8. An apparatus, comprising:
a gas distribution showerhead comprising a body having a first major surface and a second major surface opposite the first major surface, the body having a plurality of gas passages formed between the first major surface and the second major surface, each of the plurality of gas passages having a first opening formed in the first major surface that is fluidly coupled to a second opening formed in the second major surface by a restricting orifice;
a plurality of center support members coupled to the body in a center region thereof; and
a plurality of mid-support members coupled to the body between the center region and the side, wherein at least a portion of one or both of the center support members and mid support members comprise a suspension feature, the suspension feature comprising an interface body located outside of the gas distribution showerhead, wherein the interface body includes an opening which receives a fastener which is disposed in a first gas passage of the plurality of gas passages.

9. The apparatus of claim 8, wherein at least a portion of one or both of the center support members and the mid-support members includes a pivoting structure providing lateral movement of the body.

10. The apparatus of claim 8, wherein one or both of the center support member and the mid-support member includes a slot/key device that couples to the suspension feature.

11. The apparatus of claim 8, wherein the body includes a plurality of second gas passages surrounding the first gas passage of the plurality of gas passages, each of the plurality of gas by-pass holes being formed through the body from the first major surface at an angle relative to the longitudinal direction of the gas passage of the plurality of gas passages and terminating within the body to intersect with the gas passage.

12. The apparatus of claim 11, wherein each of the plurality of second gas passages comprise a laterally oriented bore.

13. The apparatus of claim 11, wherein each of the plurality of second gas passages include one or more bores each of which extend at least partially through one or more adjacent first gas passages of the plurality of gas passages.

14. The apparatus of claim 13, wherein each of the one or more bores terminate at a position upstream of the restricting orifice.

15. The apparatus of claim 8, wherein the interface body comprises a circular body with an exterior taper.

16. An apparatus, comprising:
a gas distribution showerhead comprising a body having a side and a first major surface and a second major surface opposite the first major surface, the body having a plurality of first gas passages formed between the first major surface and the second major surface, each of the plurality of gas passages comprising a first gas passage having a first bore formed in the first major surface that is fluidly coupled to a second bore formed in the second major surface by a restricting orifice;
a plurality of second gas passages surrounding one of the first gas passages of the plurality of first gas passages, each of the plurality of second gas passages being formed through the body from the first major surface at an angle relative to the longitudinal direction of the first gas passage of the plurality of first gas passages and terminating within the body to intersect with the first gas passage;
a center support member coupled to the body in a center region thereof by a first suspension feature; and
a mid-support member coupled to the body between the center region and the side by a second suspension feature, wherein at least a portion of one or both of the center support members and mid support members comprise a suspension feature, the suspension feature comprising an interface body located outside of the gas distribution showerhead, wherein the interface body includes an opening which receives a fastener which is disposed in the first gas passage of the plurality of first gas passages.

17. The apparatus of claim 16, wherein the suspension feature comprises one or more extended sections coupled to the interface body.

18. The apparatus of claim 16, wherein the interface body comprises a circular body with an exterior taper.

* * * * *